United States Patent
Dabiri et al.

(10) Patent No.: US 8,472,514 B2
(45) Date of Patent: Jun. 25, 2013

(54) ADAPTIVE SPECTRAL ENHANCEMENT AND HARMONIC SEPARATION

(75) Inventors: Dariush Dabiri, San Jose, CA (US); Maged F. Barsoum, Saratoga, CA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 304 days.

(21) Appl. No.: 12/952,178

(22) Filed: Nov. 22, 2010

(65) Prior Publication Data

US 2012/0013398 A1 Jan. 19, 2012

Related U.S. Application Data

(60) Provisional application No. 61/399,720, filed on Jul. 14, 2010.

(51) Int. Cl.
*H03H 7/30* (2006.01)

(52) U.S. Cl.
USPC ........... 375/233; 375/254; 375/284; 375/296; 375/346; 375/350

(58) Field of Classification Search
USPC .................. 375/233, 254, 284, 296, 346, 350
See application file for complete search history.

(56) References Cited

U.S. PATENT DOCUMENTS

| | | | |
|---|---|---|---|
| 6,904,443 B2 | 6/2005 | White | |
| 6,976,044 B1 | 12/2005 | Kilani | |
| 7,003,094 B2 | 2/2006 | Fischer et al. | |
| 7,741,921 B2 | 6/2010 | Ismailov | |
| 2003/0127913 A1* | 7/2003 | Roberts et al. | ................... 307/89 |
| 2003/0165205 A1 | 9/2003 | Chu et al. | |
| 2007/0009011 A1 | 1/2007 | Coulson | |
| 2008/0112525 A1 | 5/2008 | Do et al. | |
| 2008/0267392 A1 | 10/2008 | Raheja et al. | |
| 2009/0061808 A1 | 3/2009 | Higgins | |
| 2009/0238102 A1 | 9/2009 | Dabiri | |
| 2009/0252234 A1 | 10/2009 | Samdani et al. | |
| 2011/0296267 A1* | 12/2011 | Malkin et al. | ................. 714/746 |

OTHER PUBLICATIONS

U.S. Appl. No. 61/399,720, pp. 49.
U.S. Appl. No. 12/952,154, pp. 49.
U.S. Appl. No. 12/952,164, pp. 35.
U.S. Appl. No. 12/952,172, pp. 28.
U.S. Appl. No. 12/952,150, pp. 52.
U.S. Appl. No. 12/952,184, pp. 34.
U.S. Appl. No. 12/952,193, pp. 35.

(Continued)

*Primary Examiner* — Kabir A Timory

(57) ABSTRACT

A circuit and method perform adaptive spectral enhancement at a frequency ω1 (also called "fundamental" frequency) on an input signal y which includes electromagnetic interference (EMI) at an unknown frequency, to generate a fundamental-enhanced signal φ1 (or its complement). The fundamental-enhanced signal φ1 (or complement) is thereafter used in a notching circuit (also called "fundamental notching" circuit) to generate a fundamental-notched signal y−φ1. The fundamental-notched signal y−φ1 is itself enhanced to generate a harmonic-enhanced signal φ2 that is used to notch the fundamental-notched signal y−φ1 again, in one or more additional notching circuits that are connected in series with the fundamental notching circuit. The result ("cascaded-harmonic-notched" signal) is relatively free of EMI noise (fundamental and harmonics), and is used as an error signal for an adaptation circuit that in turn identifies the fundamental frequency ω1. Use of a cascaded-harmonic-notched signal as the error signal improves speed of convergence of adaptation.

20 Claims, 13 Drawing Sheets

OTHER PUBLICATIONS

Ungerboeck, G. "10GBASE-T Coding and Modulation: 128-DSQ + LDPC", IEEE P802.3an Task Force, Ottawa, Sep. 29-Oct. 1, 2004, pp. 15.

"802.3an-2006 IEEE Standard for Information Technology-Telecommunications and Information Exchange Between Systems-Local and Metropolitan Area Networks-Specific Requirements, Part 3: Carrier Sense Multiple Access With Collision Detection (CSMA/CD) Access Method and Physical Layer Specifications", Sep. 2006, pp. 167.

Stolle, R. "Electromagnetic Coupling of Twisted Pair Cables", published in IEEE Journal on Selected Areas in Communications, vol. 20, No. 5, Jun. 2002, pp. 883-891.

Nehorai, A. et al., "Adaptive Comb Filtering for Harmonic Signal Enhancement", published in IEEE Transactions on Acoustics, Speech, and Signal Processing, vol. ASSP-34, No. 5, Oct. 1986, pp. 1124-1138.

Nehorai, A. "A Minimal Parameter Adaptive Notch Filter With Constrained Poles and Zeros", published in IEEE Transactions on Acoustics, Speech, and Signal Processing, vol. ASSP-33, No. 4, Aug. 1985, pp. 983-996.

Stoica, P. et al. "Performance Analysis of an Adaptive Notch Filter with Constrained Poles and Zeros", published in IEEE Transactions on Acoustics, Speech, and Signal Processing, vol. 36, No. 6, Jun. 1988, pp. 911-919.

MaCleod, M.D. "Fast Nearly ML Estimation of the Parameters of Real or Complex Single Tones or Resolved Multiple Tones", published in IEEE Transactions on Signal Processing, vol. 46, No. 1, Jan. 1998, pp. 141-148.

* cited by examiner

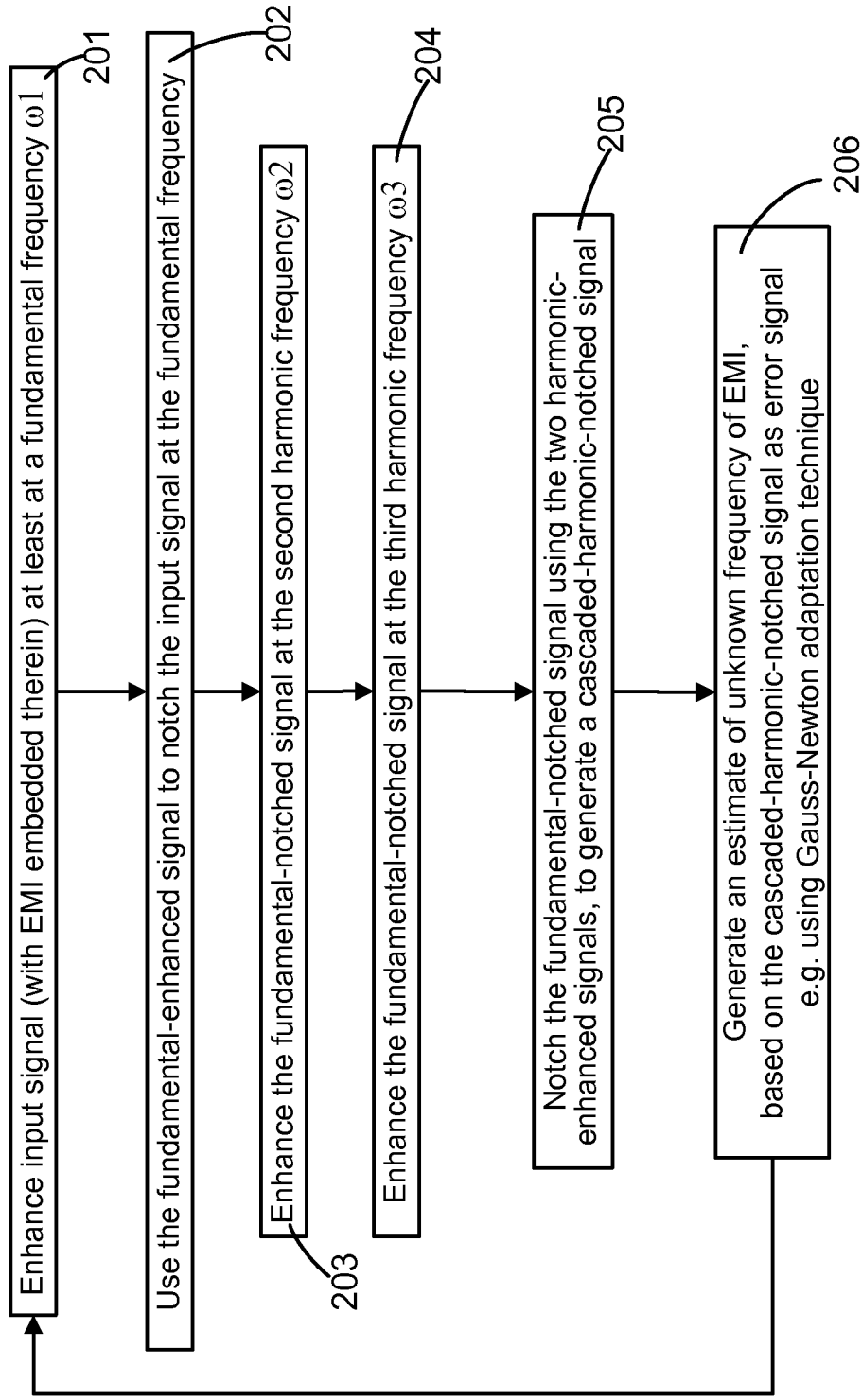

ADAPTIVE SPECTRAL ENHANCEMENT AND HARMONIC SEPARATION

CROSS-REFERENCE TO PROVISIONAL APPLICATION

This application claims priority under 35 USC §119 (e) from a provisional application, namely U.S. Application No. 61/399,720 filed on Jul. 14, 2010 having the title "EMI cancellation method and apparatus", filed by Dariush Dabiri, which is incorporated by reference herein in its entirety.

CROSS-REFERENCE TO RELATED APPLICATIONS

This patent application is related to and incorporates by reference herein in their entirety, the following patent applications that are co-owned and concurrently filed herewith:
(1) U.S. patent application, entitled "Stabilized Digital Quadrature Oscillator" by Dariush Dabiri et al., Ser. No. 12/952,154;
(2) U.S. patent application, entitled "Detection and Estimation of Narrowband Interference By Matrix Multiplication" by Dariush Dabiri, Ser. No. 12/952,164;
(3) U.S. patent application, entitled "Confirmation of Presence of Narrowband Interference By Harmonic Analysis" by Dariush Dabiri et al., Ser. No. 12/952,172;
(4) U.S. patent application, entitled "Narrowband Interference Cancellation Method and Circuit" by Dariush Dabiri, Ser. No. 12/952,150;
(5) U.S. patent application, entitled "Adaptive Narrowband Interference Prediction Circuit and Method" by Dariush Dabiri et al., Ser. No. 12/952,184; and
(6) U.S. patent application, entitled "Multi-Input IIR Filter with Error Feedback" by Maged F. Barsoum, et al., Ser. No. 12/952,193.

BACKGROUND

In a local area network, a PHY device 12 in a computer 10 (FIG. 1A) may be connected to another PHY device 22 in an Ethernet Switch 20 by use of a cable 32. Cable 32 typically includes four twisted-pair copper conductors 32A-32D (which may be shielded or unshielded) that carry analog signals between four transceivers 12A-12D in PHY device 12 (that in turn is coupled to MAC device 11) and four transceivers 22A-22D in PHY device 22 (that in turn is coupled to MAC device 21). Each of transceivers 12A-12D typically includes a transmit data path and a receive data path in an integrated circuit (IC) die that forms PHY device 12. The transmit data path typically includes an FEC encoder, transmit circuitry, a digital to analog converter, an analog filter, and a line driver, illustrated unlabeled in FIG. 1A. Similarly, the receive data path typically includes corresponding components in a reverse order, e.g. a receive amplifier, an analog filter, an analog to digital converter, receive circuitry and an FEC decoder (also see FIG. 1A).

A signal received from cable 32 by any of transceivers 22A-22D is typically weak, and any degradation affects the bit error rate (BER). Degradation of the signal during transmission across cable 32 occurs for a number of known reasons, such as echo due to reflections in cable 32, near end cross talk (NEXT) and far end cross talk (FEXT) due to the adjacency of conductors in cable 32, attenuation caused by length of cable 32, etc. Such reasons for degradation are internal to a communication channel that is formed between transceivers 12A-12D, 22A-22D by cable 32. Such internally-originated noise depends strictly on the physical characteristics of cable 32 and its connections to transceivers 22A-22D. Several prior art techniques have been developed, to suppress or cancel such internally-originated noise.

The signal transmitted through cable 32 (FIG. 1A) is occasionally further degraded by noise that originates externally ("externally-generated noise"). For example, coupling of electromagnetic energy radiated by a wireless device 31, such as a walkie-talkie typically occurs in cable 32, resulting in noise therein due to electromagnetic interference (EMI). The amount of such EMI noise that gets injected into a signal in cable 32 increases as the distance reduces between wireless device 31 and cable 32. When wireless device 31 is sufficiently close, the EMI noise picked up by cable 32 can so severely corrupt a signal carried therein that a link drop occurs. The amount of EMI noise that is picked up by a signal travelling through cable 32 depends on various characteristics of cable 32, such as shielding and grounding. When cable 32 is used to transfer data at a high rate, such as 10 Gbps, the current inventor believes that prior art shielding and become insufficient e.g. because electromagnetic fields penetrate through such shielding and induce currents in cable 32.

Adaptive notch filtering is a prior art technique for removing sinusoids of unknown frequencies. An article entitled "Adaptive comb filtering for harmonic signal enhancement," by A. Nehorai and B. Porat, published in IEEE Trans. Acoust., Speech, Signal Processing, Vol. ASSP-34, pp. 1124-1138, October 1986 is incorporated by reference herein in its entirety. This article describes an algorithm composed of two cascaded parts, in which the first part estimates the fundamental frequency and enhances the harmonic component, while the second part estimates the harmonic amplitudes and phases. The first part implements a recursive prediction error (RPE) adaptive comb filter. The second part implements a linear recursive least squares (RLS) algorithm. The just-described algorithm requires a number of operations proportional to $n^2$ per time sample. Hence this algorithm is impractical for use in filtering EMI in real time, because time computations on the order of $n^2$ can take so long as to result in a link drop. Accordingly, improvements of the type described below are believed to be necessary.

SUMMARY

A circuit and method in accordance with the invention perform adaptive spectral enhancement at a frequency $\omega 1$ (also called "fundamental" frequency) on an input signal y which includes electromagnetic interference (EMI), thereby to generate a fundamental-enhanced signal $\phi 1$ (or its complement). The fundamental-enhanced signal (or its complement) is thereafter used in a notching circuit (also called "fundamental notching" circuit) to generate a fundamental-notched signal $y-\phi 1$. In a critical aspect of the invention, the fundamental-notched signal $y-\phi 1$ is itself notched again, in one or more additional notching circuits that are connected in series with the fundamental notching circuit, to form a cascade of notching circuits. The result of the cascade ("cascaded-harmonic-notched" signal) is relatively free of EMI noise (fundamental and harmonics), and is used as an error input signal for an adaptation circuit that in turn identifies the fundamental frequency $\omega 1$.

Use of a cascaded-harmonic-notched signal as the error input signal improves speed of convergence, in certain aspects of the invention. Moreover, use of a fundamental-notched signal to generate harmonic-enhanced signals that are in turn used to notch the fundamental-notched signal, improves convergence in several aspects of the invention. A cascade of notching circuits, including a fundamental notching circuit followed by a harmonic notching circuit, and use of the cascade to supply an error input signal to an adaptation circuit appears to be nowhere disclosed in any prior art known to the inventor(s) of the current patent application.

In an illustrative aspect of the invention, the fundamental-notched signal y−$\phi$1 is supplied in parallel, to two additional notching circuits (also called "harmonic notching" circuits), to generate signals −$\phi$2 and −$\phi$3 (that are complements of the second and third harmonic enhanced signals). Signals −$\phi$2 and −$\phi$3 are then added to a delayed version of fundamental-notched signal y−$\phi$1 to obtain the cascaded-harmonic-notched signal y−$\phi$1−$\phi$2−$\phi$3. Cascaded-harmonic-notched signal y−$\phi$1−$\phi$2−$\phi$3 is relatively free of EMI noise (fundamental and harmonics), and is used as an error input signal for an adaptation circuit that in turn identifies the fundamental frequency $\omega$1. In the illustrative aspect, a fundamental notching circuit is coupled in series with two harmonic notching circuits that in turn are coupled in parallel to one another. The number of harmonic notching circuits that are used (e.g. only one is used or two are used) depends on the number of harmonics which need to be filtered from input signal y, that in turn depends on a channel through which signal y is received.

BRIEF DESCRIPTION OF THE FIGURES

FIG. 2B illustrates, in a high level flow chart, a method in accordance with the invention to perform spectral enhancement and harmonic separation on an input signal and generate two feedback signals, followed by use of the two feedback signals to generate a coefficient signal for use in the spectral enhancement and harmonic separation.

DETAILED DESCRIPTION

A remote signal sent by a transmitter is typically received at a receiver as a received signal that includes noise, in addition to the remote signal. The noise in the received signal depends on various characteristics of the transmission medium as well as external interference. In some embodiments, the received signal is processed by a Front End Processing Circuit to cancel certain types of noise, of the type that will be readily apparent to the skilled artisan, e.g. as described in a US patent application, with Dariush Dabiri as the first-named inventor, that is concurrently filed herewith, and co-owned as follows:

(1) "Narrowband Interference Cancellation Method and Circuit", Ser. No. 12/952,150.

The just-described patent application is hereby incorporated by reference herein, in its entirety.

Figure 1A:
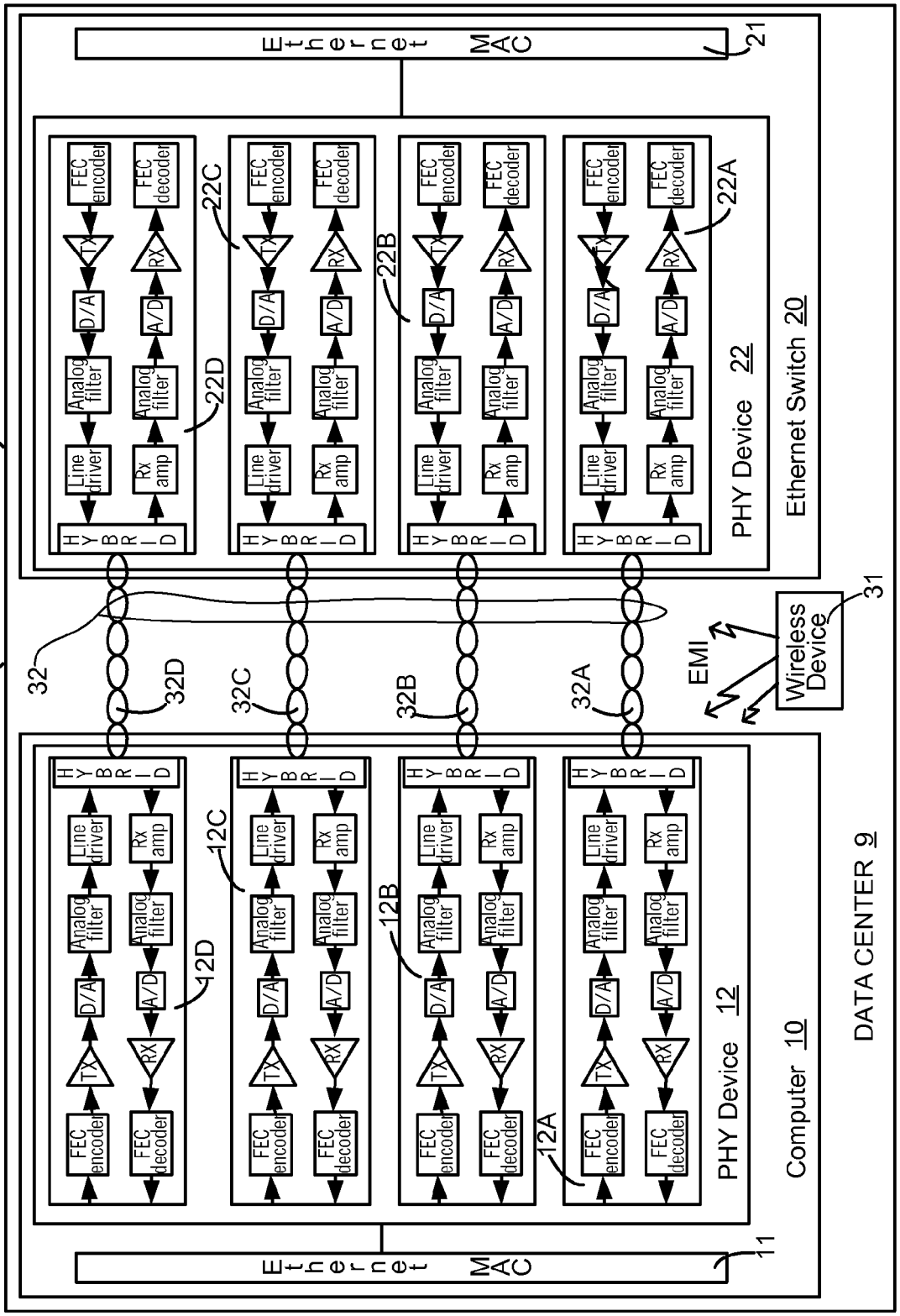
FIG. 1A illustrates, in a high level block diagram, a prior art data center 9 having a computer 10 and an Ethernet switch 20 interconnected by a cable 32, wherein cable 32 experiences electromagnetic interference (EMI) on operation of a wireless device 31.
Figure 1B:
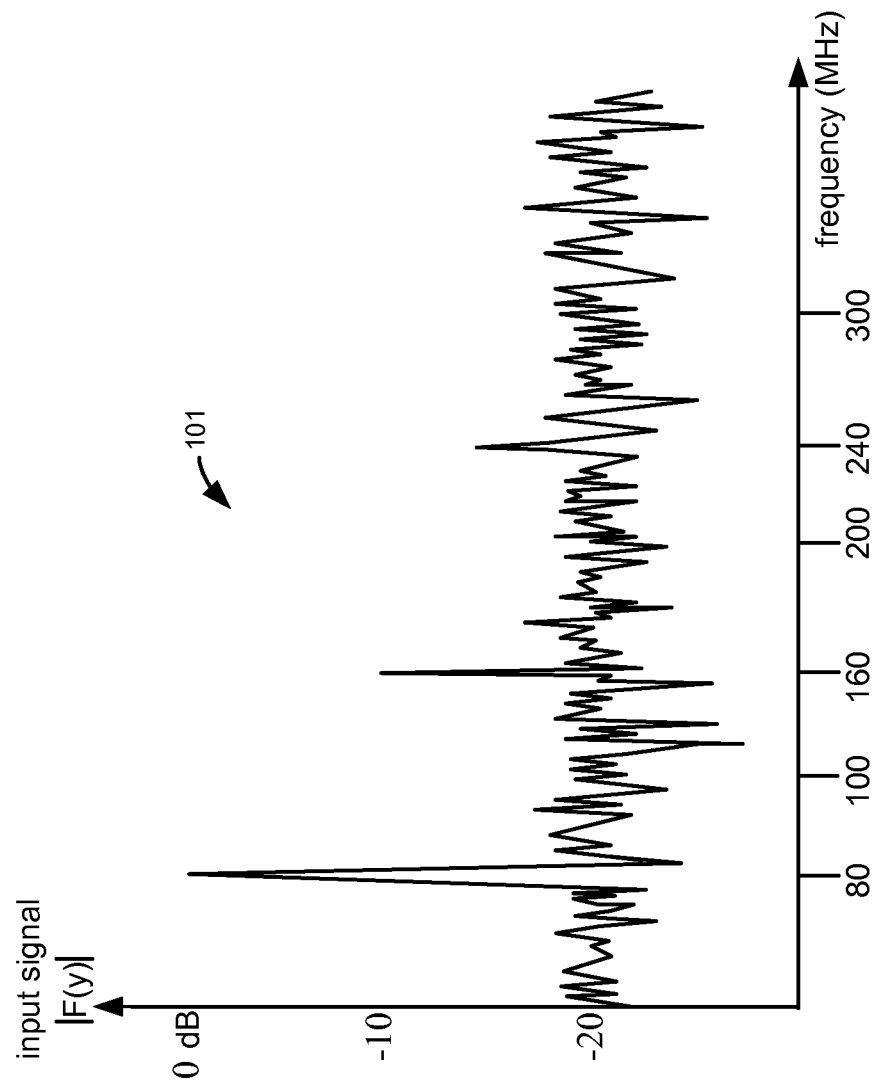
FIG. 1B illustrates, in a graph, a signal that is extracted for noise cancellation in some embodiments of the invention from a signal that is received from a remote transmitter.

In a signal 101 that is generated by such a Front End Processing Circuit, when narrowband interference is present, it may appear as peaks in the frequency domain, e.g. see peaks in signal 101 illustrated in FIG. 1B. Such peaks are cancelled in some embodiments of the invention by using such a signal 101 in adaptive spectral enhancement as follows.

In accordance with the invention, a circuit 100 (FIG. 2A) includes an adaptation circuit 120 that generates a coefficient signal $\theta$ on a coefficient output port 125 that is coupled to a coefficient input line 124 of a circuit 114. The term "output port" is used herein to denote a connection point available outside a circuit, e.g. a point in one or more line(s) at which a signal exits from the circuit. Circuit 114 enhances the spectrum of y(t) at a fundamental frequency $\omega$1 (determined by coefficient signal $\theta$) on an input signal y(t) received on an input line 111, thereby to generate a complement −$\phi$1 of the fundamental-enhanced signal $\phi$1. The fundamental-enhanced signal $\phi$1 (or its complement, depending on the embodiment) is supplied to adaptation circuit 120 for use in generating coefficient signal $\theta$.

Figure 2A:
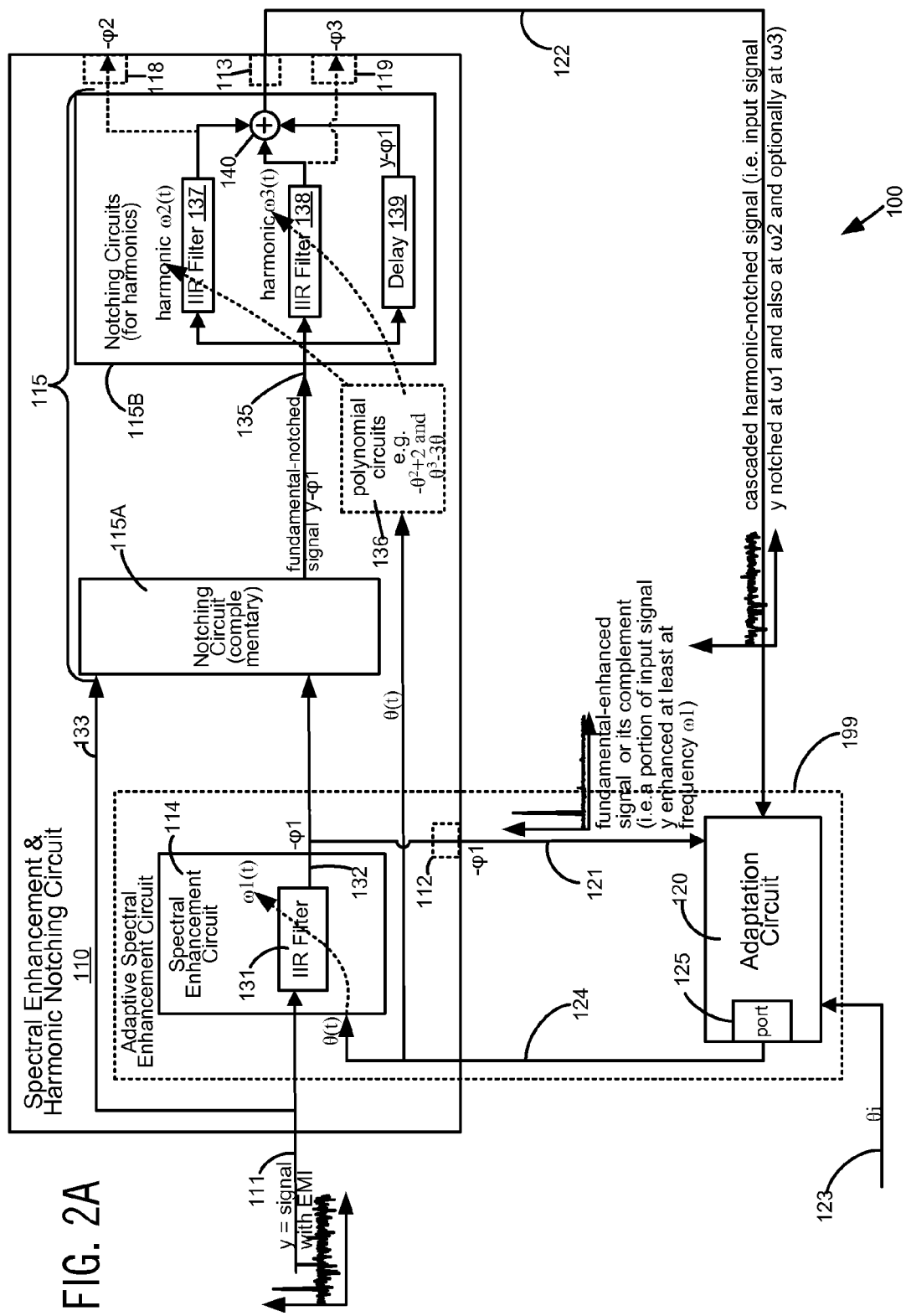
FIG. 2A illustrates, in a high level block diagram, a circuit 100 in accordance with the invention including a spectral enhancement and harmonic notching circuit 110 that supplies two feedback signals namely a fundamental-enhanced signal and a cascaded-harmonic-notched signal, on two lines namely an input line 121 and an error line 122 respectively, of an adaptation circuit 120 that in turn supplies a coefficient signal on an output port 125 that is coupled to line 124 to circuit 110.

In FIG. 2A, circuits 114 and 120 together constitute an adaptive spectral enhancement circuit 199 that can be implemented in any manner that will be readily apparent to a skilled artisan. For example, in some aspects of the invention, circuit 114 includes an infinite impulse response (IIR) filter 131 that has its center frequency identified by a time-varying coefficient signal $\theta$(t) received on coefficient input line 124. IIR filter 131 is coupled between input line 111 and an internal line 132. The center frequency of filter (also called "first IIR filter", or "fundamental IIR filter") 131 is determined by the coefficient signal $\theta$ received on coefficient input line 124. For example, $\omega$1(t)=$f_s$*$\cos^{-1}$(−$\theta$(t)/2) wherein $f_s$ is the sampling frequency. Similarly, adaptation circuit 120 is implemented in some aspects of the invention by a gradient filter that generates a gradient signal (based on a Gauss-Newton method for error prediction), and a coefficient update circuit that uses the gradient signal to generate coefficient signal $\theta$. Hence, adaptive spectral enhancement circuit 199 can be implemented in different ways, depending on the aspect of the invention.

Figure 3A:
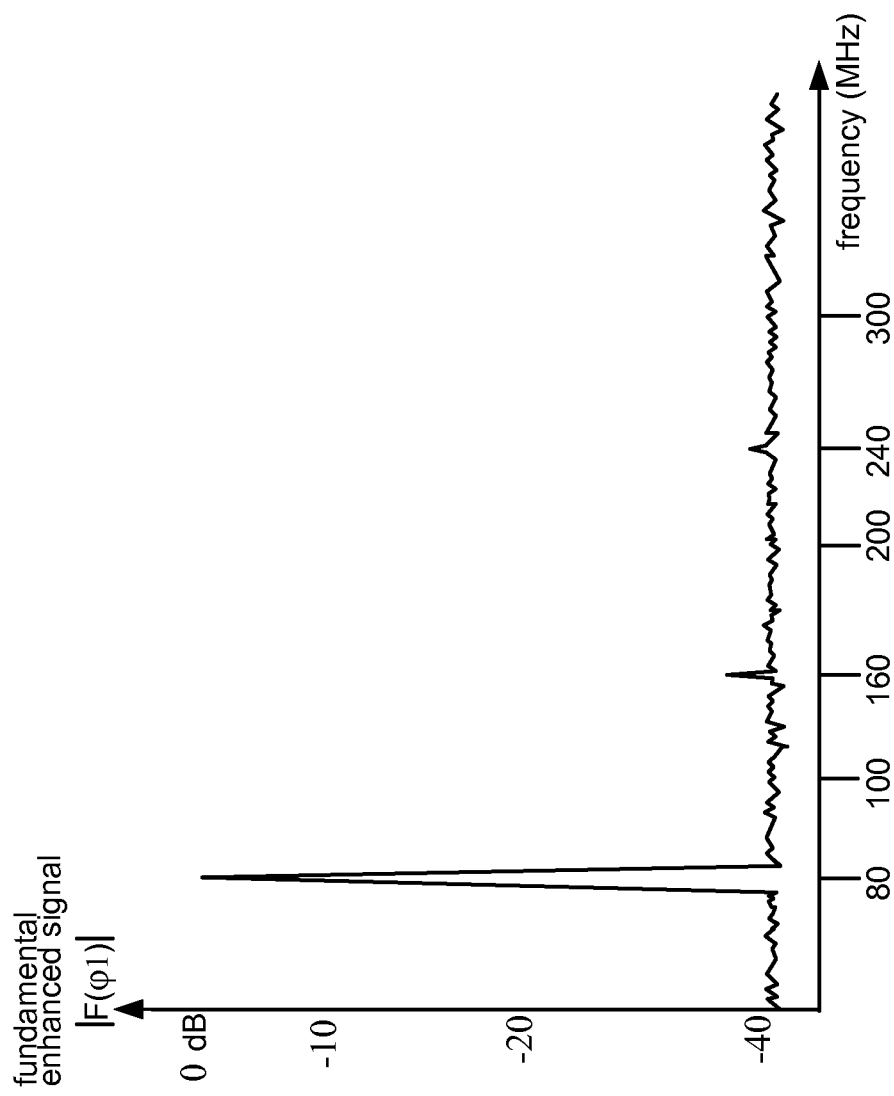
FIGS. 3A-3E illustrate, in graphs, signals in the circuit 100 in some aspects of the invention.
Figure 3B:
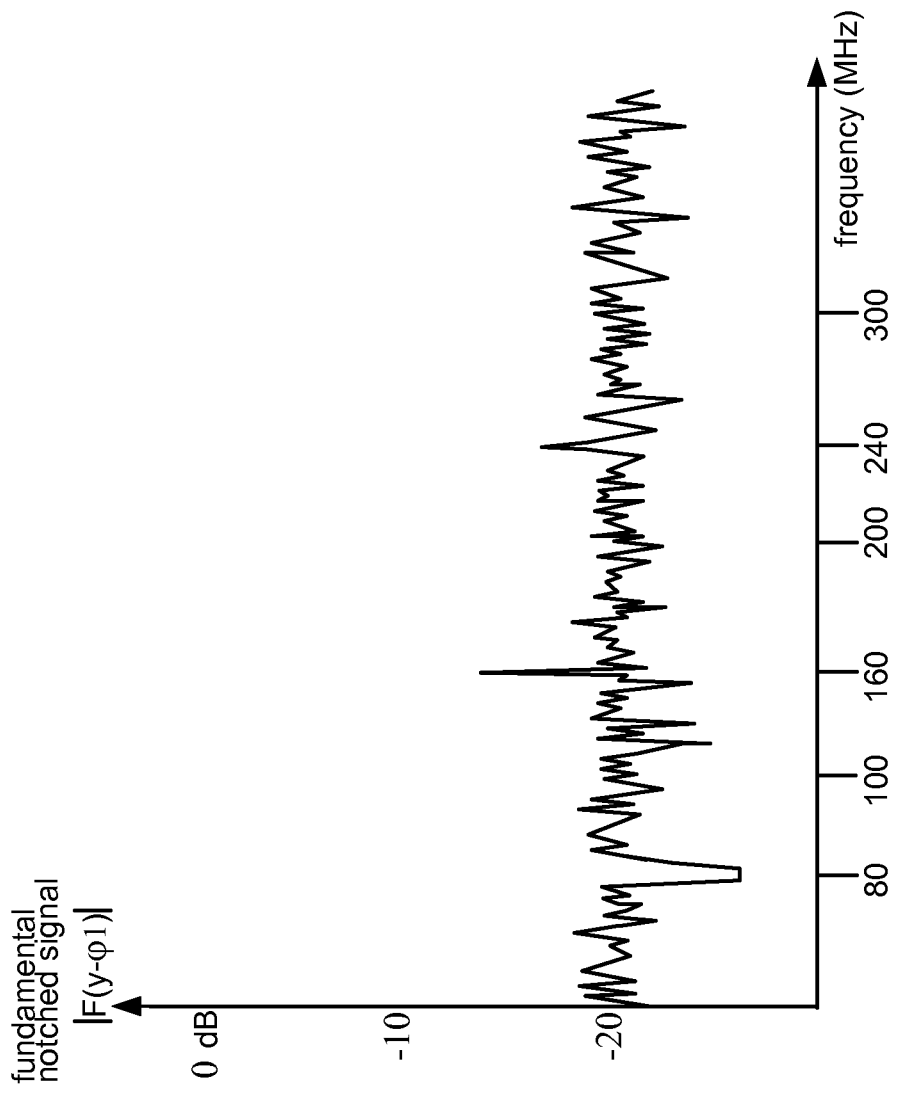
Figure 3C:
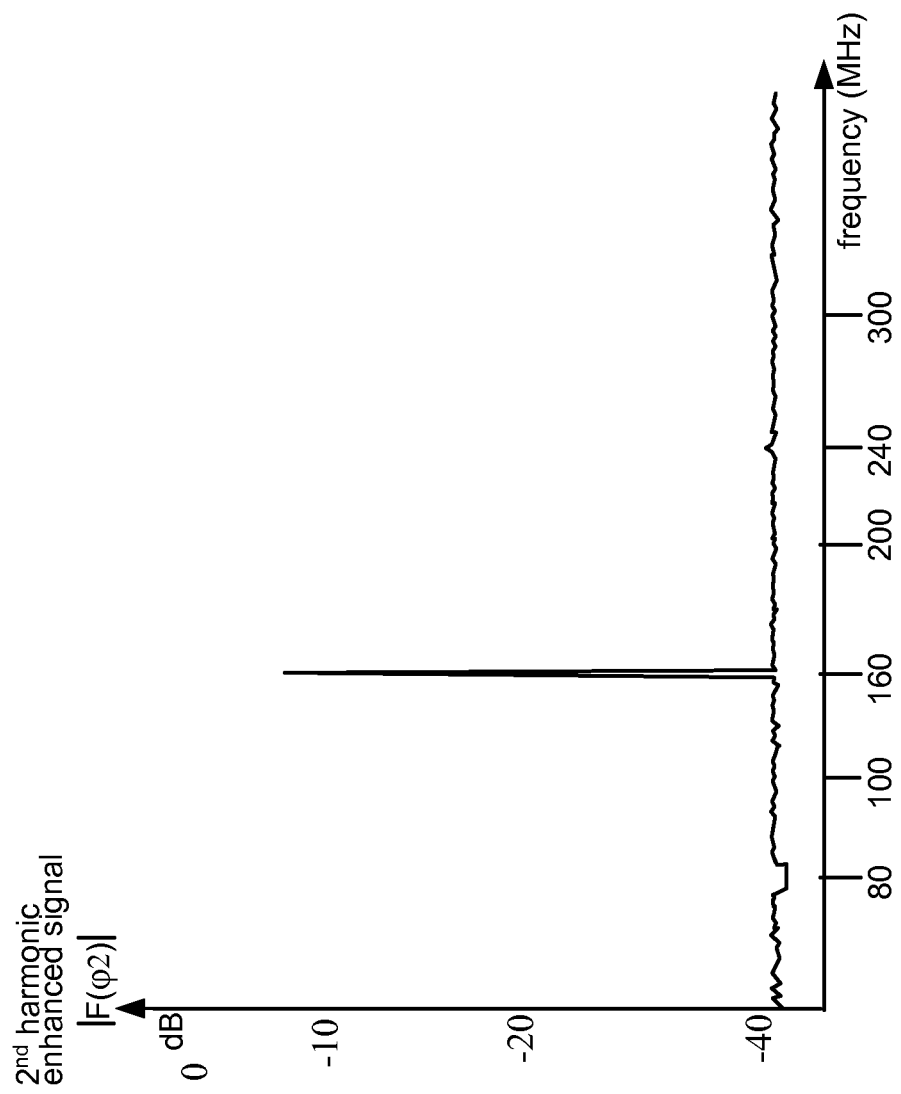

Therefore, spectral enhancement circuit 114 supplies on an internal line 132, the signal $\phi$1 generated by enhancement of the input signal at the fundamental frequency (called fundamental-enhanced signal; see FIG. 3A). Internal line 132 is coupled to a cascade 115 of notching circuits that are also included in circuit 110. Cascade 115 includes a first notching circuit 115A (also called "complementary notching circuit") that receives, in addition to the enhanced signal (or its complement, depending on the aspect of the invention) on line 132, the input signal y(t) on line 133. Notching circuit 115A notches (as per act 202 in FIG. 2B) signal y(t) at the fundamental frequency ω1 thereby to generate on line 135 (FIG. 2A), a fundamental notched signal y−φ1 (as illustrated in FIG. 3B) or a scaled version thereof, e.g. scaled by (1/ρ).

Generally speaking, signals φ1, φ2, and φ3 are spectrally-enhanced versions (and in some aspects of the invention, band-passed versions) of the input signal y(t) at (1) the first harmonic frequency ω1, (2) second harmonic frequency ω2 and (3) third harmonic frequency ω3. More specifically, in some aspects of the invention, signal φ2 is the filtered version of (1/ρ) (y−φ1) at the second harmonic frequency ω2 and similarly the signal φ3 is the filtered version of (1/ρ) (y−φ1) at the third harmonic frequency ω3. Therefore, in such aspects of the invention, φ2 and φ3 are both cascaded-harmonic-enhanced signals, which are then used by an arithmetic unit to generate a cascaded-harmonic-notched y−φ1−φ2−φ3.

Referring to FIG. 2, the (1/ρ) scaled version of the fundamental notched signal is received on line 135 by a cascade 115 and then notched therein, by one or more additional notching circuits 115B (also called "harmonic notching circuits"), to generate the cascaded-harmonic-notched signal. Notching circuits 115B notch the fundamental notched signal (more specifically, its scaled version) at one or more additional harmonic frequencies ω2, ω3 (in addition to first harmonic frequency ω1). Hence, cascade 115 generates on an output port 113 (of circuit 110), either cascaded-harmonic-notched y−φ1−φ2 (see FIG. 3F) or cascaded-harmonic-notched y−φ1−φ2−φ3 (see FIG. 3E).

Figure 3D:
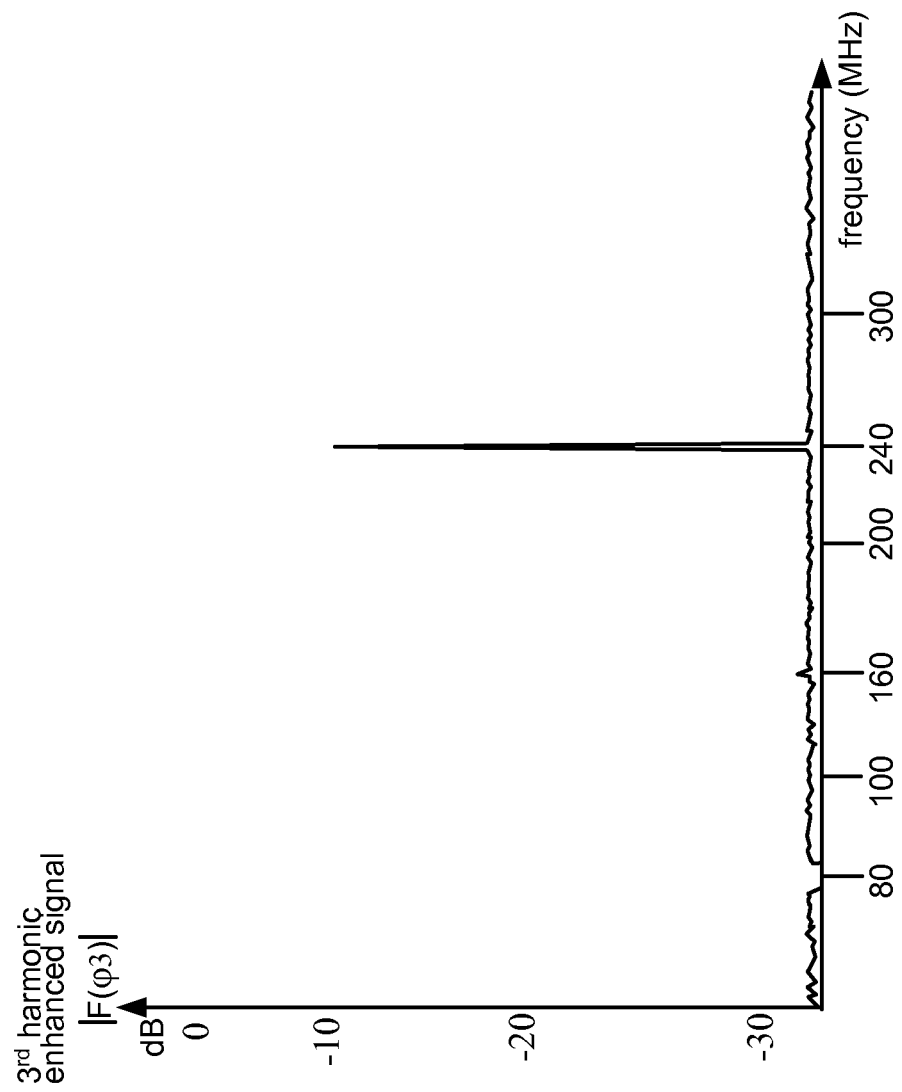
Figure 3E:
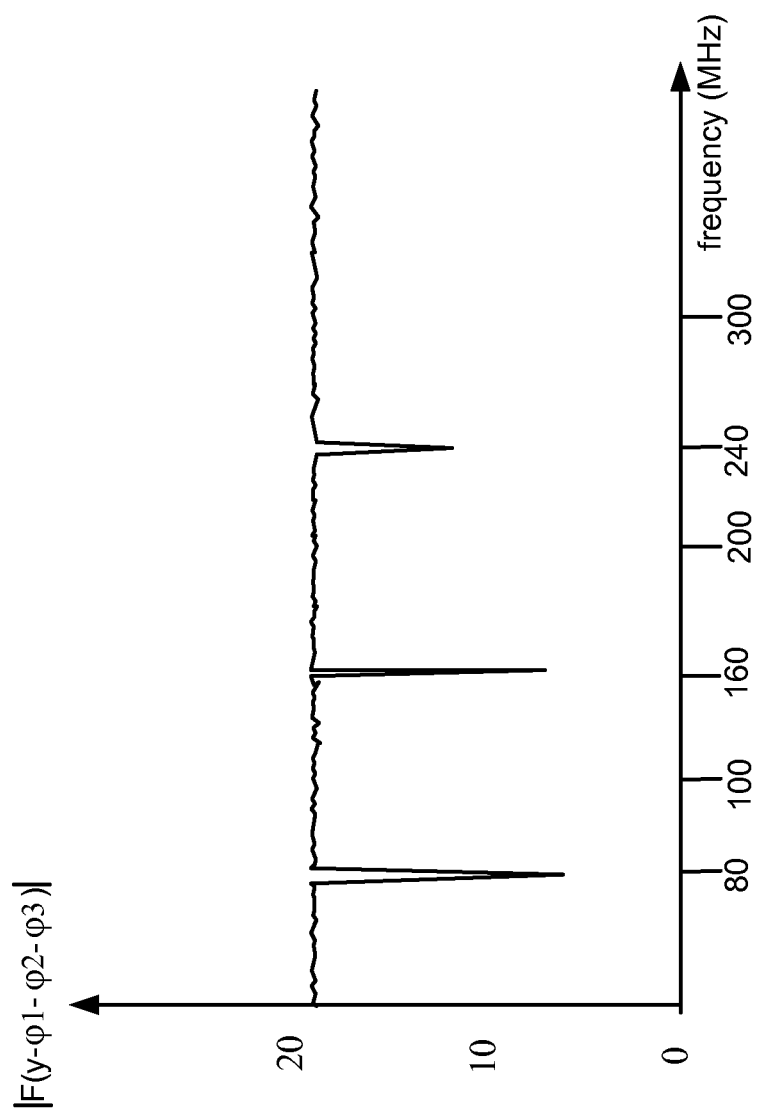

In some aspects of the invention, the harmonic notching circuits 115B of FIG. 2A are implemented by use of additional IIR filters 137 and 138 that are coupled in parallel (relative to one another) between line 135 and an adder 140 included in notching circuits 115B. IIR filter (also called "second IIR filter" or "harmonic IIR filter") 137 enhances (as per act 203 in FIG. 2B) the fundamental notched signal y−φ1 at the second harmonic frequency ω2, thereby to generate signal −φ2 (as illustrated in FIG. 3D) supplied to adder 140. Note that signal −φ2 is a complement of a portion of signal (1/ρ) (y−φ1) enhanced at the second harmonic frequency ω2. Similarly, IIR filter (also called "third IIR filter" or "harmonic IIR filter") 138 enhances (as per act 204 in FIG. 2B) the same signal (1/ρ) (y−φ1) at the third harmonic frequency ω3, thereby to generate signal −φ3 (as illustrated in FIG. 3E) also supplied to adder 140.

In the circuit illustrated in FIG. 2A, signals −φ2 and −φ3 generated by IIR filters 137 and 138 are supplied to ports 118 and 119 respectively, for use outside of circuit 110, e.g. in EMI cancellation. The frequencies ω2 and ω3 are identified for the pair of harmonic notching circuits 115B by a corresponding pair of polynomial circuits 136. Polynomial circuits 136 use the coefficient signal θ(t) received by circuit 110 on line 124, to compute a second coefficient signal θ2 as $-\theta^2+2$, for use in controlling the center frequency of IIR filter 137. Similarly, polynomial circuits 136 also compute $\theta^3-3\theta$ for use as a third coefficient signal θ3 used to control the center frequency of IIR filter 138. Note that the polynomials $-\theta^2+2$ and $\theta^3-3\theta$ can be computed by circuits 136 differently in different aspects of this invention.

Figure 3F:
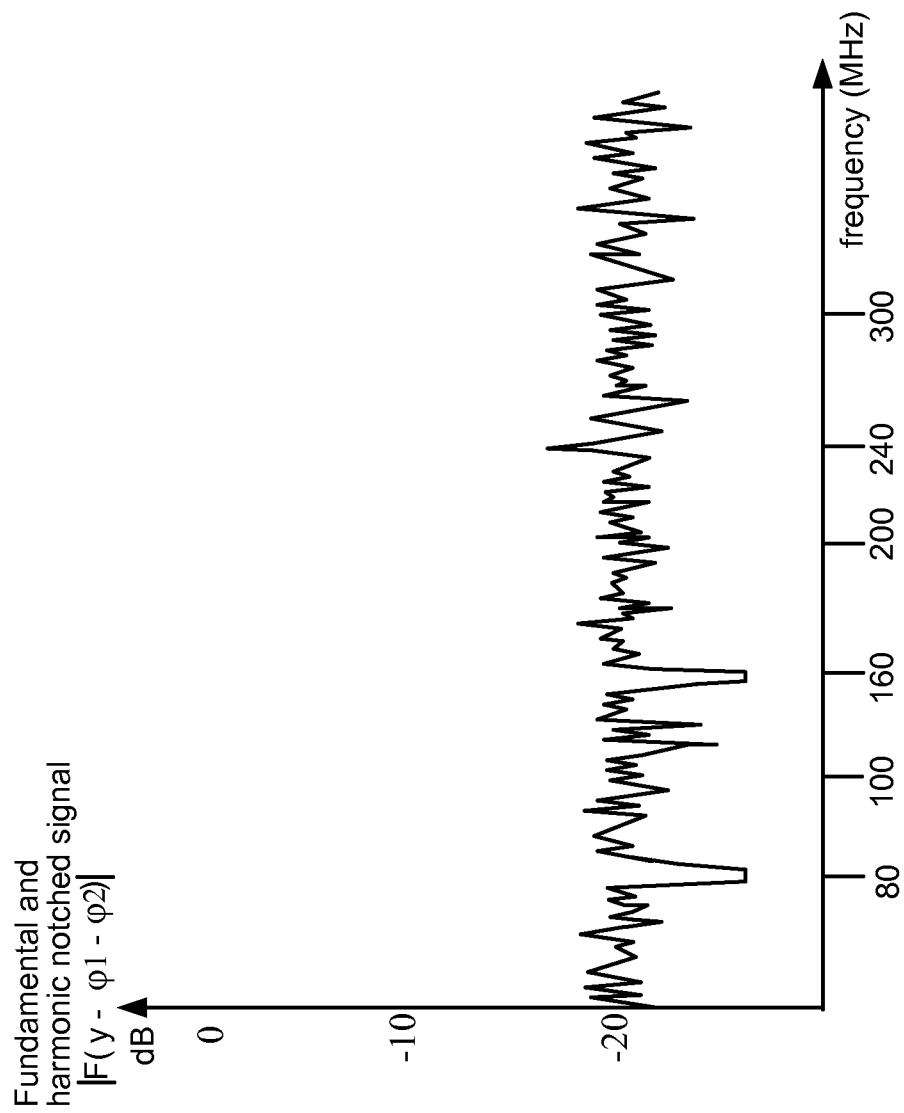
FIG. 3F illustrates, also in a graph, a cascaded-harmonic-notched signal that is used as an error input signal, in an alternative aspect of the invention.

In circuits 115B of FIG. 2A, an adder 140 notches (as per act 205 in FIG. 2B) the scaled version (1/ρ) (y−φ1) of the fundamental notched signal y−φ1 at the harmonic frequencies ω2 and ω3 by adding thereto the (1/ρ) scaled versions of the complement of the harmonic-enhanced signals −φ2 and −φ3 generated by IIR filters 137 and 138. Adder 140 adds signals −φ2 and −φ3 to a version of fundamental notched signal that has been delayed by a delay element 139 also included in notching circuits 115B, in parallel with IIR filters 137 and 138. The duration of delay element 139 is predetermined (e.g. 5 samples) to match a duration of signal propagation through IIR filters 137 and 138. In this manner, adder 140 generates a (1/ρ) scaled version of the cascaded-harmonic-notched signal y−φ1−φ2−φ3 (as illustrated in FIG. 3F) on output port 113.

In FIG. 2A, fundamental IIR filter 131 and harmonic IIR filter 137 are arranged in series relative to one another, and similarly fundamental IIR filter 131 and harmonic IIR filter 138 are also arranged in series relative to one another, while the two harmonic IIR filters 137 and 138 are arranged in parallel relative to one another. Use of a series-parallel arrangement of IIR circuits 131, 137 and 138, to generate an error input signal for adaptation circuit 120, is believed to be nowhere disclosed in any prior art known to the current inventor(s).

As noted above, adaptive spectral enhancement and circuit 100 in FIG. 2A includes adaptation circuit 120 which generates (as per act 206 in FIG. 2B) coefficient signal θ on a coefficient output port 125. Adaptation circuit 120 of FIG. 2A receives the fundamental-enhanced signal φ1 (or its complement −φ1) as an input signal (i.e. a feedback signal) on an input line 121 (also called "adaptation input line") that is coupled to port 112 of circuit 110. Moreover, adaptation circuit 120 also receives a cascaded-harmonic-notched signal or a scaled version thereof, as an error input signal (i.e. another feedback signal) on an error line 122 (also called "adaptation error line") that is coupled to port 113 of circuit 110. Note that the cascaded-harmonic-notched signal generated by the circuit 110 at output port 113 is signal y−φ1−φ2−φ3 which is triply notched, at each of three frequencies ω1, ω2 and ω3 (see FIG. 3F).

To summarize, a current estimate of fundamental frequency ω1 is generated in the form of coefficient signal θ (as illustrated by act 153 in FIG. 2AB) by adaptation circuit 120, based on the two feedback signals namely the fundamental-enhanced signal φ1 and cascaded-harmonic-notched signal y−φ1−φ2−φ3. In addition to the two feedback signals, adaptation circuit 120 also uses an initial estimate of the unknown frequency of EMI, identified by an initial coefficient θi received on an initialization line 123 also input to adaptation circuit 120.

Figure 5:
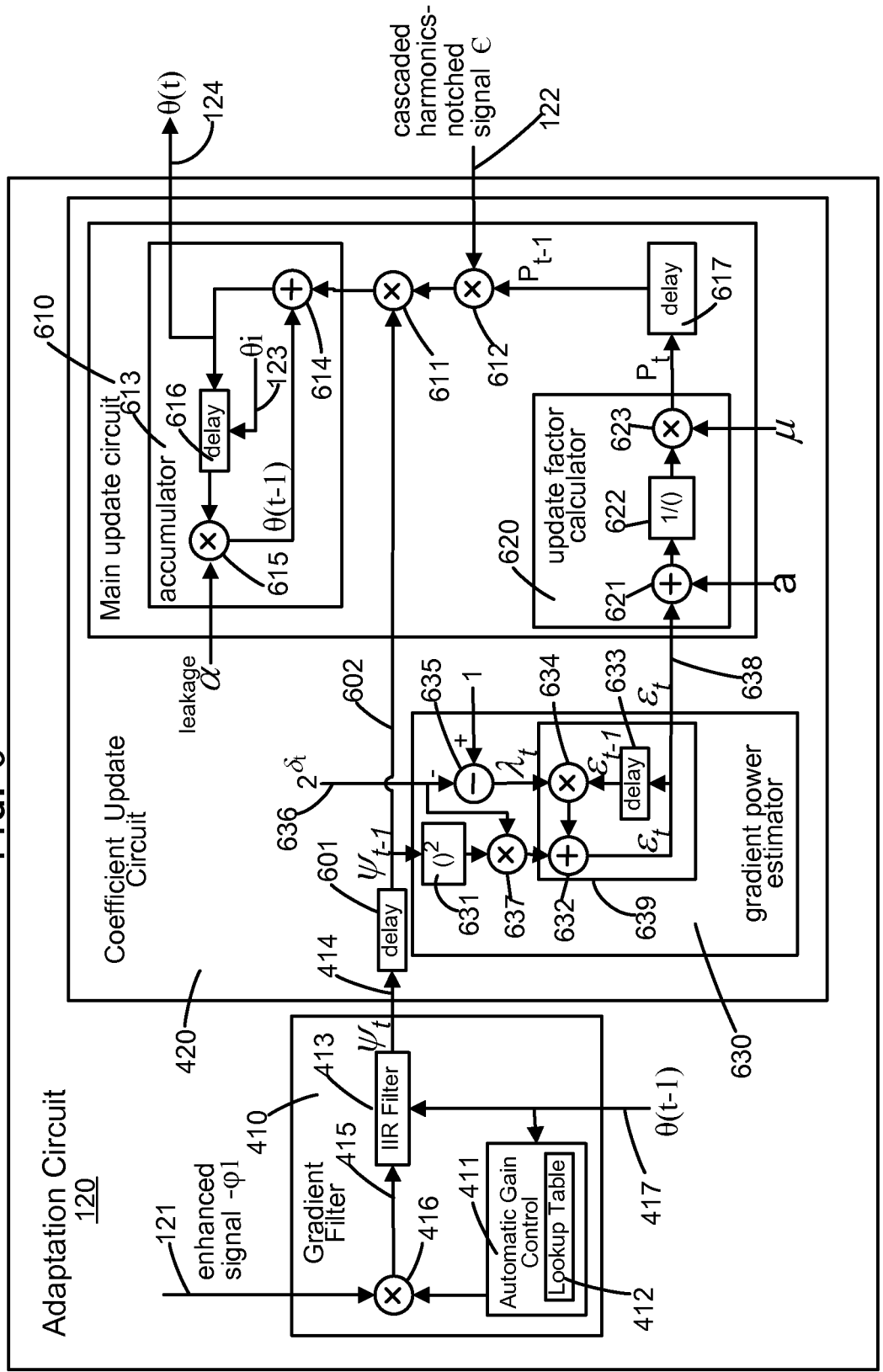
FIG. 5 shows an illustrative aspect of the invention in a low level block diagram, wherein gradient filter 410 of FIG. 4 is implemented with an automatic gain control that includes a lookup table to scale the signal −$\phi$1 followed by an IIR filter 413, and wherein coefficient update filter 420 of FIG. 4 is implemented by a gradient power estimator 630, an update factor calculator 620 and an accumulator 613.

Depending on the aspect of the invention, adaptation circuit 120 may generate coefficient signal θ in any manner apparent to the skilled artisan in view of this disclosure. In some aspects of the invention, adaptation circuit 120 is internally configured to multiply the error input signal received on adaptation error line 122 with a signal that is derived from the fundamental-enhanced signal received on adaptation input line 121 (by use of a gradient filter). In such aspects of the invention, adaptation circuit 120 supplies a scaled version of the product of multiplication, to an accumulator (not shown in FIG. 2A). Depending on the aspect of the invention, different factors can be used in scaling the multiplication product, although a specific scaling factor $P_{t-1}$ is used in one illustrative aspect of the invention shown in FIG. 5 and described below.

In several aspects of the invention, adaptation circuit 120 starts with an initial estimate θi of the coefficient signal received on an initialization line 123, from an external circuit, such as a coarse frequency estimator. Adaptation circuit 120 thereafter supplies a time-varying coefficient θ(t) on coefficient output port 125, as the sum of the initial coefficient signal θi and the above-described scaled version of the multiplication product, accumulated over time (with or without leakage in accumulation, depending on the aspect of the invention).

Note that circuit 114 is also referred to as a spectral enhancement circuit; and circuit 110 is also referred to as a spectral enhancement and harmonic notching circuit. As noted above, circuit 110, cascade 115 and adaptation circuit 120 are together included in circuit 100 which is also referred to as an adaptive spectral enhancement and harmonic separation circuit. Generation of a cascaded-harmonic-notched signal in circuit 110 by two or more IIR filters arranged in an cascade, and use of the cascaded-harmonic-notched signal as a feedback signal to adaptation circuit 120 appears to be nowhere disclosed in any prior art known to the inventor(s) of the current patent application.

Figure 4:
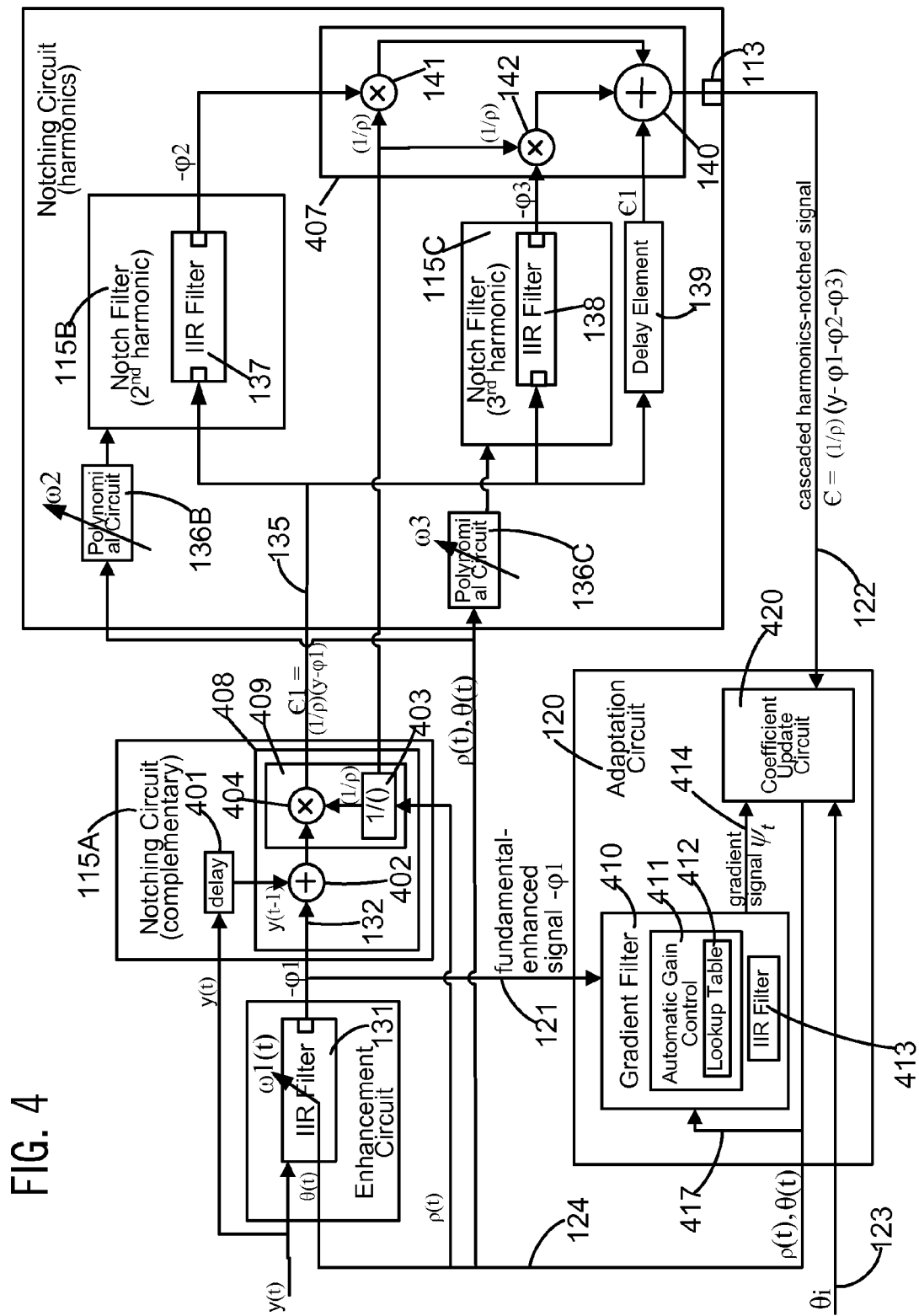
FIG. 4 illustrates, in an intermediate level block diagram, an illustrative aspect of circuit 100 of FIG. 2A with the cascaded-harmonic-notched signal scaled by an inverse (1/$\rho$) of bandwidth $\rho$ and wherein adaptation circuit 120 includes a gradient filter that derives a gradient signal $\psi$ from the complement −$\phi$1 of the fundamental-enhanced signal.

In one illustrative aspect of the invention shown in FIG. 4, notching circuit 115A scales the fundamental notched signal $y-\phi 1$ with the scaling factor $(1/\rho)$ wherein $\rho(t)$ is a coefficient that identifies bandwidth to be enhanced in the spectrum of the input signal $y(t)$. Moreover, in FIG. 4, each of IIR filters 137 and 138 has its input port coupled to line 135, and as noted above, line 135 carries the $(1/\rho)$ scaled version of notched signal $y-\phi 1$ from complementary notching circuit 115A. Moreover each of IIR filters 137 and 138 in FIG. 4 has its output port coupled to adder 140 via corresponding multipliers 141 and 142. Multipliers 141 and 142 supply to adder 140, the $(1/\rho)$ scaled versions of the two complementary band-passed signals $-\phi 2$ and $-\phi 3$ (centered at respective frequencies $\omega 2$ and $\omega 3$). Adder 140 of FIG. 4 is additionally coupled to a delay element 139 to receive therefrom a delayed version of the signal on line 135. Thus adder 140 of FIG. 4 generates at output port 113, the signal $(1/\rho)(y-\phi 1-\omega 2-\phi 3)$ which is therefore applied to adaptation circuit 120 as the second feedback signal.

Note that complementary notching circuit 115A of FIG. 4 does not include any IIR filter. Instead, circuit 115A of FIG. 4 includes a delay element 401 that is coupled to input line 111, to receive the input signal $y(t)$. Therefore, a delayed version $y(t-1)$ is supplied by delay element 401 to an adder 402 also included in circuit 115A of FIG. 4. Adder 402 is also coupled by line 132 to an output port of IIR filter 131 thereby to receive therefrom the fundamental-enhanced signal's complement, namely signal $-\phi 1$. Adder 402 adds the two inputs thereby to generate $y(t-1)-\phi 1$ and supplies this result to a multiplier 404 also included in complementary notching circuit 115A. Multiplier 404 scales the signal $y(t-1)-\phi 1$ input from adder 402 with the above-described scaling factor $(1/\rho)$. Note that scaling factor $(1/\rho)$ is generated in the illustrative aspect shown in FIG. 4 by a circuit 403 to implement an inverse function $1/(\ )$ on a bandwidth coefficient $\rho(t)$ that is also output by adaptation circuit 120.

Note that circuit 409 (FIG. 4) to generate scaled signal $(1/\rho)(y-\phi 1)$ can be implemented differently in different aspects of this invention. Moreover, in some aspects there is no scaling, i.e. $\rho$ is set to the fixed value of 1. In one illustrative aspect of the invention, $\rho=(1-2^{\delta})$ and hence the inverse value $(1/\rho)$ is implemented based on a truncated series of powers of two, namely $1+2^{-\delta}+2^{-2\delta}$ which is used with two adders to sum up the following: $(y-\phi 1)+(y-\phi 1)*2^{-\delta}+(y-\phi 1)*2^{-2\delta}$ wherein the two terms are implemented by bit shifting, e.g. $(y-\phi 1)>>\delta$ and $(y-\phi 1)>>2\delta$. Numerous such details will be apparent to the skilled artisan, in view of this detailed description.

In FIG. 4, adder 302, multiplier 404, and inverter 403 together form a first arithmetic unit 408 that is coupled between the output port of fundamental IIR filter 131 and the input port of harmonic IIR filter 137. First arithmetic unit 408 is also coupled between the output port of fundamental IIR filter 131 and the input port of harmonic IIR filter 138. Similarly, in FIG. 4, adder 140, multiplier 141, and multiplier 142 together form a second arithmetic unit 407 that is coupled between the output port of harmonic IIR filter 137 and the output port 113. Second arithmetic unit 407 is also coupled between the output port of harmonic IIR filter 138 and the output port 113. Second arithmetic unit 407 is further coupled between the delay element 139 and the output port 113. Therefore, each of IIR filters 137 and 138 as well as delay element 139 are coupled in parallel relative to one another, between the first arithmetic unit 408 and the second arithmetic unit 407.

In the illustrative aspect of the invention shown in FIG. 4, adaptation circuit 120 includes a gradient filter 410 that receives the fundamental-enhanced signal's complement namely signal $-\phi 1$ on input line 121 and generates a gradient signal $\psi_t$ on a line 414 that is coupled to a coefficient update circuit 420 included in adaptation circuit 120. Gradient filter 410 of FIG. 4A includes an automatic gain control (AGC) circuit 411 that is implemented by a lookup table (LUT) 412. In some aspects of the invention, the time-varying coefficient $\theta(t)$ described above is received on line 417 and used to perform a lookup of table 412 to obtain the gain to be applied. Moreover, gradient filter 410 of FIG. 4A also includes an IIR filter 413 to generate the gradient signal $\psi_t$ on line 414. The center frequency of IIR filter 413 is also determined by the time-varying coefficient $\theta(t)$. An input line 415 (FIG. 6) of IIR filter 413 is coupled to an output port (not shown) of multiplier 416. Multiplier 416 in turn is coupled to receive signals from each of AGC circuit 411 and input line 121. Multiplier 416 performs multiplication of the scaling factor from AGC circuit 411 with the fundamental-enhanced signal's complement, namely signal $-\phi 1$ received on input line 121 and supplies the product of multiplication on line 414.

Figure 6:
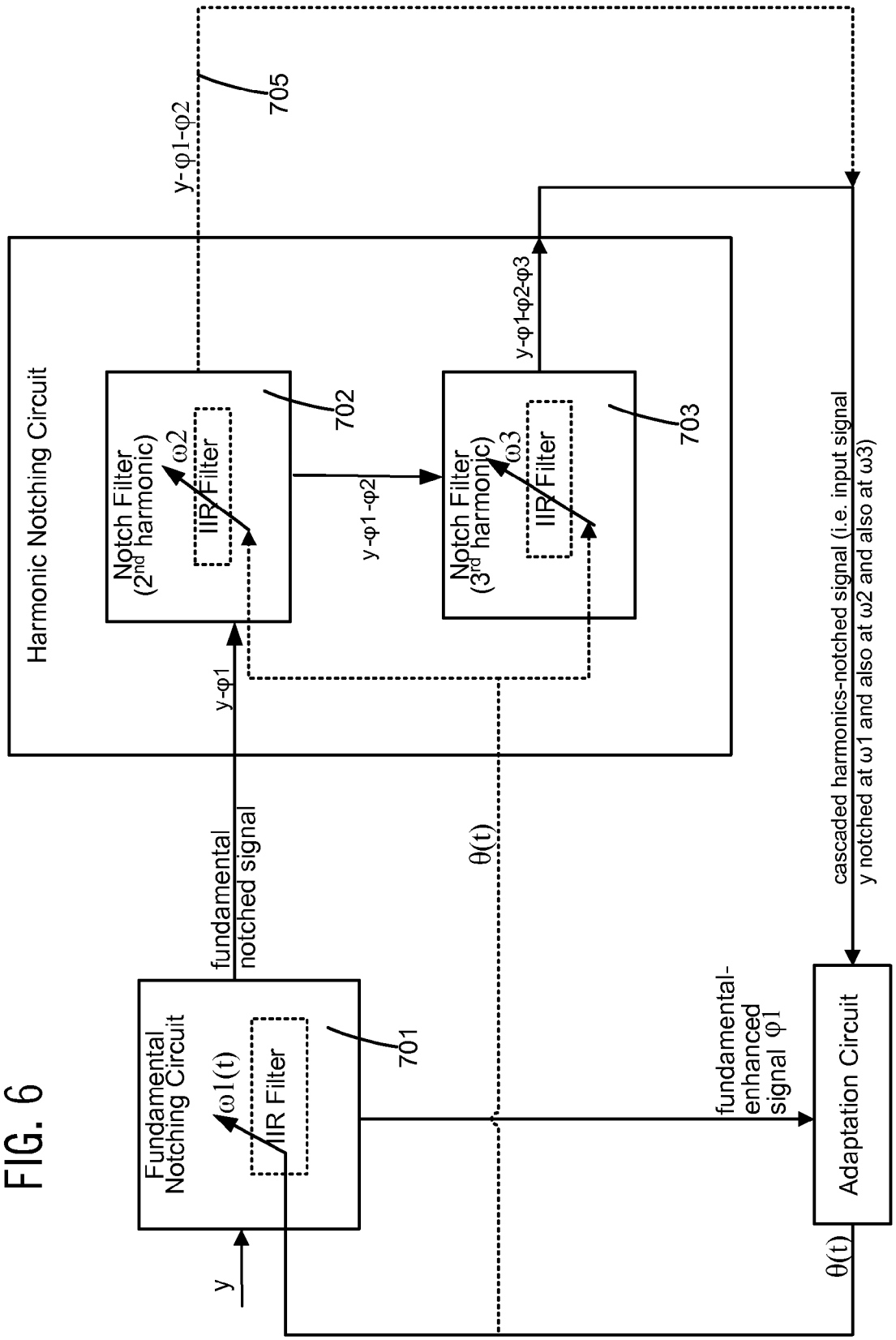
FIG. 6 illustrates an alternative aspect of the invention, wherein the second harmonic notch filter is connected in series with the third harmonic notch filter, to generate a triply-cascaded-notched signal that is input to an adaptation circuit.

Line 414 of FIG. 6 is connected to a delay element 601 included in coefficient update circuit 420. Delay element 601 supplies a delayed version of gradient signal $\psi_t$ on a line 602 that is coupled to a multiplier 611 included in a main update circuit 610 that in turn is included in coefficient update circuit 420. Multiplier 611 multiplies the delayed gradient signal $\psi_{t-1}$ with a scaled version of the notched signal received on adaptation error line 122 and supplies the product to an accumulator 613. Accumulator 613 includes an adder 614 that adds the product from the multiplier 611 to either (1) a value $\theta(t-1)$ for the coefficient from a previous iteration received from multiplier 615 after being delayed by delay element 616 and scaled by a leakage factor $\alpha$ (e.g. selected to be 1 for no leakage or $1-2^{-10}$ for some leakage) in each iteration, or (2) an initial value $\theta i$ if this is the first iteration. Scaling of the notched signal on line 122 is performed by another multiplier 612 that receives a delayed scaling factor $P_{t-1}$ from a delay element 617.

Delay element 617 in turn generates delayed scaling factor $P_{t-1}$ from a current scaling factor $P_t$. Current scaling factor $P_t$ is generated by an update factor calculator 620 that implements the equation: $P_t=\mu/(a+\epsilon_t)$ wherein $\epsilon_t$ is the power of the gradient output, which is generated by a gradient power estimator 630. Specifically, calculator 620 includes an adder 621 to add a constant "a" and gradient output power "$\epsilon_t$," and supply the sum resulting from addition to an inverter 622. The constant "a" is a positive value that is preselected to compensate for the probability that $\epsilon_t$ may have a small value that can cause inverter 622 to generate a huge output value. The value for "a" depends on the aspect of the invention, e.g. 8 or 16. A result $1/(a+\epsilon_t)$ from inverter 622 is supplied to a multiplier 623 that multiplies the result with $\mu$, so as to generate the current scaling factor $P_t$ supplied to delay element 617. μ is a constant value for the adaptation rate which is preselected, depending on the aspect of the invention, e.g. 0.25 or 0.5.

Update factor calculator 620 receives $\epsilon_t$ from a sliding window gradient power estimator 630 of the type illustrated in FIG. 6. Sliding window gradient power estimator 630 implements the equation $\epsilon_t = \lambda_{t-1} * \epsilon_{t-1} + \psi_{t-1}^2$ wherein $\psi_{t-1}$ is the delayed version of the gradient signal, generated on line 602 by delay element 601 as described above. In the just-described equation, the forgetting factor $\lambda_{t-1} = 1 - 2^{-\delta 1(t)}$ is an exponentially increasing sequence, wherein $\delta 1$ is an integer that is incremented by 1 by a counter (not shown) for each value of λ in the sequence. Estimator 630 of FIG. 6 includes a squaring circuit 631 that is coupled to line 602 to receive therefrom $\psi_{t-1}$. Squaring circuit 631 supplies its output to a multiplier 637 that multiplies the value $\psi_{t-1}^2$ with $2^{\delta 1}$ i.e. the value $1 - \lambda_{t-1}$ thereby to generate a value to be accumulated by an accumulator 639 that includes an adder 632. The range of values of $\delta 1$ is typically predetermined, based on the application e.g. between 3 and 10.

Adder 632 is coupled to a multiplier 634 also included in accumulator 639, to receive therefrom a scaled value of $\epsilon_{t-1}$. Specifically, multiplier 634 multiplies $\epsilon_{t-1}$ with the above-described $\lambda_{t-1}$ and supplies the product to adder 632. Adder 632 supplies the result of adding $\lambda_{t-1} * \epsilon_{t-1} + (1 - \lambda_{t-1}) * \psi_{t-1}^2$ on a line 638, as the signal $\epsilon_t$ which is input to adder 621 of update factor calculator 620. Accumulator 639 also includes a delay element 633 that receives the signal $\epsilon_t$ from line 638 and supplies a delayed version $\epsilon_{t-1}$ to multiplier 634 (described above). Estimator 630 also includes a subtractor 635 that generates the above-described $\lambda_{t-1}$ by subtracting from the value 1, the value of $2^{\delta 1}$ which is received on a line 636.

In an illustrative aspect of the invention, the lookup table 412 (FIG. 6) which is included in AGC circuit 411 is initialized with values that are selected to neutralize the gain in IIR filter 413. Specifically, table 412 in the illustrative aspect of the invention is implemented as a one-dimensional table, that is looked up using a current value of the time-varying coefficient θ(t) generated on the coefficient output port 125 of the adaptation circuit 120. In the illustrative aspect of the invention, the value of gain selected to be an average across a range of values (e.g. eight values) of the coefficient ρ(t) that identifies bandwidth. For example $\rho(t) = 1 - 2^{-\delta 2(t)}$ wherein $\delta 2$ is an integer having a range of values that depends on the application, e.g. between 4 and 11. Note that use of a one-dimensional table in the AGC circuit 411 is more memory efficient than using a two-dimensional table with both coefficients θ(t) and ρ(t) as inputs. Therefore, the gain in the gradient filter 410, between fundamental-enhanced signal's complement namely signal $-\phi 1$ on input line 121 received as input and output signal $\psi_t$ supplied as output on line 414, is maintained approximately at unity, i.e. the value 1.

In one aspect of the invention, spectral enhancement and harmonic notching circuit 110 supplies to adaptation circuit 120 as an error input signal on adaptation error line 122, a signal that is only doubly notched, e.g. at the two frequencies ω1 and ω2, i.e. the cascaded-harmonic-notched signal y–φ1–φ2. Hence, in this aspect of the invention, the spectral enhancement and harmonic notching circuit 110 does not include the third IIR filter 138 shown in FIG. 2A.

In one alternative aspect of the invention, the fundamental-notched signal y–φ1 generated by a fundamental notching circuit 701 (FIG. 6) is supplied to only a single harmonic notching circuit (e.g. circuit 702 in FIG. 6) that contains an IIR filter to generate the complement signal –φ2 of the second harmonic-enhanced signal, which is then added to the delayed version of fundamental-notched signal y–φ1 to obtain a cascaded-harmonic-notched signal y–φ1–φ2 which is then supplied (e.g. see line 705 in FIG. 6) as the error input signal. In another alternative aspect of the invention, the cascaded-harmonic-notched signal y–φ1–φ2 is generated as just described in the previous sentence, and the cascaded-harmonic-notched signal y–φ1–φ2 is then supplied to another harmonic notching circuit 703 that is arranged in series (see FIG. 6). Circuit 703 includes an IIR filter to generate therein complement signal –φ3 of the third harmonic-enhanced signal, which is then added to a delayed version of signal y–φ1–φ2 to obtain a cascaded-harmonic-notched signal y–φ1–φ2–φ3 which is then used as the error input signal for adaptation.

As described in the immediately-preceding paragraph, a serial arrangement of IIR filters is used to generate a cascaded-harmonic-notched signal in some aspects of the invention. However, use of such a serial arrangement (as shown in FIG. 6) can result in a delay (relative to a series-parallel arrangement shown in FIG. 2A), although such delay may be acceptable in some applications. Note that the arrangements shown in FIGS. 2A and 6 both use a cascaded harmonic-notched signal as an error signal in adaptation, in accordance with the invention.

Embodiments of the type described herein may be used to implement 10GBASE-T PHYs of the type described in a Preliminary Product Brief document entitled "Triveni Dual/Quad Port 10GBASE-T PHY" published July 2010 by AMCC that is incorporated by reference herein in its entirety, and available at the following address on the Internet, wherein forward slash has been replaced by "%" sign. http:%%www.appliedmicro.com%MyAMCC%retrieveDocument%MXD%TechDocs%APM9xxxx%APM96892_93_94_95%APM96892_93_94_95_Triveni_PB2162.pdf One or more circuits and/or methods described herein may be implemented and/or performed in various ways. For example, one or more features and/or circuit elements and/or method steps/acts described above and/or illustrated in FIGS. 2A, 2B, 3A-3E, 4, 5, and 6 may be implemented in hardware, firmware, software, or a combination thereof. For several implementations, one or more features and/or circuit elements and/or method steps/acts described above and/or illustrated in the just-described figures may be used and/or implemented within specific hardware, e.g. one or more application specific integrated circuits (ASICs), digital signal processors (DSPs), programmable logic devices (PLDs), field programmable gate arrays (FPGAs), processors, controllers, micro-controllers, microprocessors, electronic devices, circuits and systems designed to perform the functions described herein, or a combination thereof. For certain implementations, one or more features and/or circuit elements and/or method steps/acts described above and/or illustrated in the just-described figures may be implemented with modules (e.g., procedures, functions, and so on) that perform the functions described herein by use of software and/or firmware executing in hardware of the type just described in the previous sentence. Additionally, any non-transitory machine readable medium tangibly embodying instructions may be used in implementing one or more features and/or circuit elements and/or method steps/acts described above and/or illustrated in the above-described figures. Also, as used herein the terms "memory" and "storage element" refer to any type of long term, short term, volatile (e.g. DRAM), nonvolatile (e.g. SRAM), flip-flop, latch, or other memory that is non-transitory and accessible by any circuitry, such as a processor.

Numerous modifications and adaptations of the embodiments and aspects described herein will become apparent to the skilled artisan in view of this disclosure. Numerous modifications and adaptations of the embodiments and aspects described herein are encompassed by the scope of the invention.

What is claimed is:

1. An apparatus to perform adaptive spectral enhancement and harmonic separation, the apparatus comprising:
   a spectral enhancement and harmonic notching circuit comprising a coefficient input line, a signal input line, a first output port and a second output port;
   wherein the spectral enhancement and harmonic notching circuit receives on the signal input line, an input signal comprising electromagnetic interference (EMI) at an unknown frequency;
   wherein the spectral enhancement and harmonic notching circuit comprises a spectral enhancement circuit to supply on the first output port, a fundamental-enhanced signal or complement thereof generated by enhancing the input signal at least at a current estimate of the unknown frequency, the current estimate being identified from a coefficient signal on the coefficient input line;
   wherein the spectral enhancement and harmonic notching circuit further comprises a cascade of notching circuits to supply on the second output port, a cascaded-harmonic-notched signal generated by notching the input signal at the current estimate followed by notching at a harmonic of the current estimate;
   an adaptation circuit comprising an initialization line, an input line, an error line, and a coefficient output port;
   wherein the input line of the adaptation circuit is coupled to the first output port, of the spectral enhancing and harmonic notching circuit;
   wherein the error line of the adaptation circuit is coupled to the second output port, of the spectral enhancing and harmonic notching circuit;
   wherein the adaptation circuit generates the coefficient signal on the coefficient output port, using at least: (i) the fundamental-enhanced signal or complement thereof received on the input line of the adaptation circuit, (ii) the cascaded-harmonic-notched signal received on the error line, and (iii) an initial estimate of the unknown frequency received on the initialization line;
   wherein the coefficient output port of the adaptation circuit is coupled to the coefficient input line of the spectral enhancement and notching circuit, to adaptively change the current estimate over time.

2. The apparatus of claim 1 wherein:
   the adaptation circuit comprises a multiplier to multiply the cascaded-harmonic-notched signal received on the error input line with a signal derived from the fundamental-enhanced signal or complement received on the input line.

3. The apparatus of claim 2 wherein:
   the adaptation circuit comprises an accumulator to accumulate a product of the multiplier with at least said initial estimate, thereby to generate the coefficient signal;
   the accumulator comprises an adder to receive said product and a signal derived at least partially from the initial estimate of the unknown frequency identified on the initialization line;
   the accumulator further comprises a delay element coupled to the adder, to supply thereto a prior version of a sum generated by said adder.

4. The apparatus of claim 1 wherein:
   the enhancement circuit comprises an infinite impulse response (IIR) filter centered at said current estimate identified on the coefficient input line, an output port of the IIR filter being coupled to the first output port to supply thereon the complement of the fundamental-enhanced signal.

5. The apparatus of claim 4 wherein the cascade of notching circuits comprises:
   a delay element coupled to the signal input line to generate a delayed version of the input signal, the delay element implementing a delay $\Delta t$ of a duration of time required for signal propagation through the IIR filter;
   an arithmetic unit coupled to the delay element to receive the delayed version of the input signal, the arithmetic unit being further coupled to the output port of the IIR filter to receive the fundamental-enhanced signal or complement, the arithmetic unit generating a fundamental-notched signal supplied to the cascade of notching circuits.

6. The apparatus of claim 5 wherein the IIR filter is hereinafter a first IIR filter and the arithmetic unit is hereinafter first arithmetic unit, and the delay element is hereinafter first delay element, and wherein the cascade of notching circuits comprises:
   a second arithmetic unit;
   a second IIR filter coupled in series between the first arithmetic unit and the second arithmetic unit; and
   a second delay element coupled in parallel with the second IIR filter;
   wherein the second arithmetic unit receives the fundamental-notched signal from the second delay element and notches the fundamental-notched signal at a harmonic of the current estimate, based on a harmonic-enhanced signal generated by the second IIR filter.

7. The apparatus of claim 6 wherein the cascade of notching circuits further comprises:
   a third IIR filter coupled in parallel with the second IIR filter and the second delay element; and
   wherein the fundamental-notched signal is further notched by the second arithmetic unit, at another harmonic of the current estimate, generated by the third IIR filter.

8. The apparatus of claim 1 wherein:
   the adaptation circuit comprises a one-dimensional table coupled to the coefficient output port to receive therefrom the coefficient signal used as an index into the table;
   the adaptation circuit further comprises a multiplier coupled to the output of the table, the multiplier being further coupled to the input line of the adaptation circuit to receive therefrom the fundamental-enhanced signal; and
   the adaptation circuit further comprises an IIR filter coupled to the multiplier to receive a product of multiplication therefrom.

9. The apparatus of claim 4 wherein the cascade of notching circuits comprises:
   a first IIR filter to generate the complement of the fundamental-enhanced signal;
   a second IIR filter to generate a complement of a harmonic-enhanced signal, wherein the second IIR filter is coupled in series with the first IIR filter.

10. The apparatus of claim 9 wherein the cascade of notching circuits further comprises:
    a third IIR filter to generate another complement of another harmonic-enhanced signal, wherein the third IIR filter is coupled in parallel with the second IIR filter.

11. The apparatus of claim 9 wherein the cascade of notching circuits further comprises:
    a third IIR filter to generate another complement of another harmonic-enhanced signal, wherein the third IIR filter is coupled in series with the second IIR filter.

12. A method for adaptive spectral enhancement and harmonic separation, the method comprising:

enhancing an input signal that comprises electromagnetic interference (EMI) at an unknown frequency, at least at a current estimate of the unknown frequency, the current estimate being identified from a coefficient signal, thereby to generate a fundamental-enhanced signal or complement thereof;

using the fundamental-enhanced signal to notch the input signal at the fundamental frequency, thereby to generate a fundamental-notched signal;

enhancing the fundamental-notched signal at a second harmonic of the current estimate thereby to generate a second harmonic-enhanced signal;

notching the fundamental-notched signal at least at the second harmonic by using at least the second harmonic-enhanced signal thereby to generate a cascaded harmonic-notched signal; and performing adaptation to generate the coefficient signal, by using at least: (i) the fundamental-enhanced signal or complement thereof, (ii) the cascaded-harmonic-notched signal, and (iii) an initial estimate of the unknown frequency, wherein the current estimate is changed adaptively over time.

13. The method of claim 12 further comprising:

enhancing the fundamental-notched signal at a third harmonic of the current estimate thereby to generate a third harmonic-enhanced signal;

wherein the fundamental-notched signal is additionally notched at the third harmonic by use of at least the third harmonic-enhanced signal, to generate said cascaded harmonic-notched signal.

14. The method of claim 12 wherein:

said performing of adaptation comprises a Gauss-Newton method for error prediction.

15. The method of claim 12 wherein:

said enhancing of the input signal uses an infinite impulse response (IIR) filter; and said enhancing of the fundamental-notched signal uses another infinite impulse response (IIR) filter.

16. The method of claim 15 wherein:

said performing adaptation uses yet another infinite impulse response (IIR) filter.

17. The method of claim 12 wherein:

said performing of adaptation comprises multiplying the cascaded-harmonic-notched signal with a signal derived from the fundamental-enhanced signal or complement.

18. The method of claim 17 wherein said signal is derived by at least:

using the coefficient signal as an index to look up a one-dimensional table;

multiplying a value obtained by looking up the one-dimensional table with the fundamental-enhanced signal or complement; and filtering a product of said multiplying, by using an IIR filter.

19. A system for adaptive spectral enhancement and harmonic separation, the system comprising:

means for enhancing an input signal that comprises electromagnetic interference (EMI) at an unknown frequency, at least at a current estimate of the unknown frequency, the current estimate being identified from a coefficient signal, thereby to generate a fundamental-enhanced signal or complement thereof;

means for using the fundamental-enhanced signal to notch the input signal at the fundamental frequency, thereby to generate a fundamental-notched signal;

means for enhancing the fundamental-notched signal at a second harmonic of the current estimate thereby to generate a second harmonic-enhanced signal;

means for notching the fundamental-notched signal at least at the second harmonic by using at least the second harmonic-enhanced signal thereby to generate a cascaded harmonic-notched signal; and means for performing adaptation to generate the coefficient signal, by using at least: (i) the fundamental-enhanced signal or complement thereof, (ii) the cascaded-harmonic-notched signal, and (iii) an initial estimate of the unknown frequency, wherein the current estimate is changed adaptively over time.

20. The system of claim 19 wherein:

said means for enhancing of the input signal uses an infinite impulse response (IIR) filter;

said means for enhancing of the fundamental-notched signal uses another infinite impulse response (IIR) filter; and said means for performing adaptation uses yet another infinite impulse response (IIR) filter.

* * * * *